(12) United States Patent
Heffernan et al.

(10) Patent No.: US 6,303,473 B1
(45) Date of Patent: Oct. 16, 2001

(54) METHOD OF GROWING GROUP III OR GROUP III-V NITRIDE LAYER

(75) Inventors: Jonathan Heffernan, Oxford (GB); Koji Takahashi, Tenri; Hidenori Kawanishi, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/212,532

(22) Filed: Dec. 16, 1998

(30) Foreign Application Priority Data

Dec. 18, 1997 (GB) .................................................. 9726848

(51) Int. Cl.$^7$ .................................................. H01L 21/20
(52) U.S. Cl. ............................................ 438/483; 438/767
(58) Field of Search .................................... 438/478, 479, 438/483, 767, 768, 796, 779, 798, 775; 428/627; 117/84, 87; 427/532

(56) References Cited

U.S. PATENT DOCUMENTS

| | | | | |
|---|---|---|---|---|
| 4,448,633 | * | 5/1984 | Shuskus | 438/767 |
| 4,706,377 | * | 11/1987 | Shuskus | 438/528 |
| 5,464,664 | * | 11/1995 | Aydil et al. | 438/767 |
| 5,468,688 | | 11/1995 | Kohl et al. | 437/237 |
| 5,599,748 | * | 2/1997 | Holloway et al. | 438/767 |
| 5,677,538 | * | 10/1997 | Moustakas et al. | 250/370.12 |
| 5,834,379 | * | 11/1998 | Shealy et al. | 438/767 |
| 6,001,173 | * | 12/1999 | Bestwick et al. | 417/89 |

FOREIGN PATENT DOCUMENTS 06224158   8/1994  (JP) .
08070140   3/1996  (JP) .

OTHER PUBLICATIONS

Search Report for Application No. GB 9726848.6; Dated Mar. 19, 1998.

* cited by examiner

*Primary Examiner*—Savitri Mulpuri
(74) *Attorney, Agent, or Firm*—Renner, Otto, Boisselle & Sklar, LLP

(57) ABSTRACT

A method of growing a Group III or Group III-V nitride layer on a semiconductor substrate includes the steps of: locating, within a chamber, the semiconductor substrate having on its surface a Group III-V semiconductor layer incorporating a substance which is strongly reactive with nitrogen; and subsequently effecting nitridation of the Group III-V semiconductor layer by introducing a species containing nitrogen into the chamber to cause a reaction between the nitrogen and the substance.

24 Claims, 6 Drawing Sheets

METHOD OF GROWING GROUP III OR GROUP III-V NITRIDE LAYER

BACKGROUND OF THE INVENTION

1. Field of the Invention

This invention relates to growth of Group III nitride or Group III-V nitride layers on semiconductor substrates, and is concerned more particularly but not exclusively with the growth of such layers for use in electronic or optoelectronic devices, such as lasers and light-emitting diodes, for example.

2. Description of the Related Art

With growing demands for optical data storage technology capable of storing data, such as audio or video information, at very high densities using compact discs (CDs) or digital video disks (DVDs), there is an increasing need for sources of light of short optical wavelengths in the blue and ultraviolet spectral regions, for example from about 780 nm to less than 500 nm, for reading and writing of such disks. This has led to a strong interest being shown in the epitaxial growth of Group III or Group III-V nitride semiconductor materials, such as GaN, InGaN, AlGaN and InGaAsN, for optical devices such as light-emitting diodes and lasers emitting blue and ultraviolet light.

Although such devices have been fabricated, they nevertheless suffer from both fabrication and operational difficulties. Usually, such devices are grown on sapphire or silicon carbide substrates because of the lack of suitable lattice matched substrates for the devices, that is substrates having approximately the same lattice constant (about 3 Å) as the Group III nitride material. Although GaN substrates are known, they can only be produced at extremely high pressures, and currently, the largest GaN substrates have dimensions of only a few square millimeters.

Furthermore, there are considerable difficulties in growing nitride material on a sapphire or silicon carbide substrate. Specifically, there is a substantial lattice mismatch between a Group III nitride or Group III-V nitride layer and the substrate on which the layer is to be grown, and such lattice mismatch leads to strain in the layer. This strain promotes the formation of large numbers of native defects which severely affect the operation of the device. Furthermore, the substrates cannot be easily cleaved so that devices fabricated on such substrates must have sawn or etched facets which are not as flat as cleaved facets, and this tends to increase optical losses making the devices less efficient and contributing to degradation during operation. Also, sapphire is electrically insulating so that there are difficulties associated with establishing electrical connections to devices to be fabricated on sapphire substrates.

There have been several attempts to grow GaN layer on a GaAs substrate by suitable preparation of the substrate. This usually involves a degree of nitridation of the surface of the GaAs substrate as a precursor to the growth of subsequent nitride layers. The references by S. Fujieda et al. in Japanese J. Appl. Phys., vol. 30, no. 9B, pp. L1665–1667 (1991) and by A. Kikuchi et al. in Japanese J. Appl. Phys., vol. 33, no. 1, pp. 688–693 (1994) are two references which disclose such methods. GaAs material has a lattice constant of 5.65 Å so that it is not lattice matched to GaN material. However, it is possible to form a very thin layer of nitride on the surface of the GaAs substrate which acts as a strain relieving buffer layer so that further layers of nitride material may be grown on the substrate without significant defect formation, as disclosed by R. W. Ruckman et al. in Appl. Phys. Letts., vol. 59, no. 7, pp. 849–851 (1991).

Various techniques have been used for nitridation of the surface of the substrate in the growth of optical devices based on nitrides. An important consideration in the nitridation process is the mechanism by which the nitrogen reacts with the surface of the substrate. Nitrogen gas and many compounds containing nitrogen exist as very stable molecules, and hence, will not normally react easily with GaAs substrates or other substrates used in such growth methods, such as sapphire or silicon carbide substrates.

One well known technique called "cracking", which may be used to overcome this problem, is to break up the incident molecules to form nitrogen ions which react much more readily with the substrate material. In this case, the nitridation is an integral part of the growth process which may be effected by molecular beam epitaxy (MBE) or by metal organic vapor phase epitaxy (MOVPE), for example. The above-mentioned reference by Kikuchi et al. uses a radio frequency source to excite and crack the nitrogen-containing molecules. With sufficient radio frequency power, a considerable percentage of the nitrogen incident on the substrate surface is in the form of reactive nitrogen ions.

Other techniques for cracking nitrogen-containing molecules include excitation by an ultraviolet light source and excitation by a high energy electron or synchrotron source, as disclosed by M. E. Jones et al. in Appl. Phys. Letts., vol. 67, no. 4, pp. 542–544 (1995).

Various gases have been used in the nitridation process, such as nitrogen, ammonia and hydrazine, as disclosed by X. Y. Zhu et al. in J. Vac. Sci. Tech., vol. A11, no. 4, pp. 838–840 (1993) and in the aforementioned reference by S. Fujieda et al. Furthermore, ammonia gas has been frozen onto the surface of a GaAs substrate which has then been subjected to nitridation in the presence of ultraviolet light (in the aforementioned reference by R. W. Ruckman et al.). These techniques are particularly useful in the fabrication of devices in which the nitride layer is merely used as a passivation layer to reduce non-radiative recombination of free carriers and environmental degradation, such as disclosed in U.S. Pat. Nos. 4,448,633 and 5,464,664.

International Patent Publication No. WO92/12536 discloses a process for oxidation of $Al_xGa_{1-x}As$ layers (where x denotes the aluminium composition) in which the layers are heated to several hundred degrees centigrade in an atmosphere of hot water vapor. This process is termed "wet oxidation" and leads to the formation of stable oxides of aluminium, such as $Al_2O_3$. The technique is primarily used in the formation of current confinement layers in vertical cavity surface emitting lasers (VCSELs), as disclosed by M. H. MacDougal et al. in IEEE Phot. Tech. Letts., vol. 7, no. 3, pp. 229–231 (1995).

In the case of the simplest and most efficient reaction, that is the oxidation of AlAs, the proposed reaction mechanism may be simplified as:

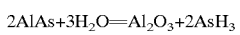

$$2AlAs + 3H_2O = Al_2O_3 + 2AsH_3$$

This reaction is energetically favorable, even at room temperature, because of the high reactivity of aluminium.

Furthermore, a method for forming a thin nitride layer by surface nitridation is disclosed in, for example, U.S. Pat. No. 5,468,688 and Japanese Laid-Open Publication No. 6-224158.

Specifically, in U.S. Pat. No. 5,468,688, a thin nitride film is formed on a surface of a substrate, for example, of GaAs, by exposing the surface to hydrazine such that the nitrogen reactants combine with and consume part of the substrate. If required, a thicker nitride film can be grown on top of the thin nitride film by use of boron reactants. This known process allows thin and thick nitride films to be produced at low temperatures and commercially practical pressures without using high energy particles. However, this type of process is not generally suitable for formation of a buffer layer permitting the subsequent growth of epitaxial nitride layer.

In the above-mentioned Japanese Laid-Open Publication, a GaAs/AlGaAs laminate is selectively etched by a process in which an AlN film is formed on the exposed AlGaAs surface which acts as an etching stopper during the etching process. The thickness of the layer is self-limited by its effectiveness as an etching stopper. Such a nitridation effect on GaAs and AlGaAs is well known in the art, as set forth above in this application.

In either of the aforementioned conventional techniques, however, a satisfactory effective process for growing a Group III or Group III-V nitride layer has not been realized.

SUMMARY OF THE INVENTION

According to the method of the present invention, a Group III-V semiconductor layer, for example, of AlGaAs, is grown on a semiconductor substrate (of any suitable semiconductor material) and then converted into a nitride layer by exposure to a suitable nitrogen-containing species, such as ammonia. Specifically, the layer is grown on top of the substrate, rather than being formed from the material of the substrate itself. This means that the substrate can be formed of any suitable material, and the buffer layer permits further growth of nitride layers by any suitable epitaxial method, such as MBE. Such growth is essentially independent of the substrate.

More specifically, according to the present invention, there is provided a method of growing a Group III nitride or Group III-V nitride layer on a suitable semiconductor substrate, comprising locating within a chamber a semiconductor substrate having on its surface a Group III-V semiconductor layer incorporating a substance which is strongly reactive with nitrogen, and subsequently effecting nitridation of the semiconductor layer by introducing a species containing nitrogen into the chamber to cause a reaction between the nitrogen and the substance.

a constituting material of the Group III-V semiconductor layer may be different from a constituting material of the substrate.

The reaction between nitrogen and the substance may cause the Group III-V semiconductor layer to convert into the nitride layer on the substrate.

For example, the nitrogen-containing species is ammonia.

The substance may include aluminium, indium, or gallium.

The Group III-V semiconductor layer may incorporate arsenic, phosphorus, aluminium gallium arsenide (AlGaAs), indium gallium arsenide (InGaAs), aluminium indium arsenide (AlInAs), or gallium indium phosphide (AlGaInP).

The substrate may be made of gallium arsenide (GaAs), silicon (Si), or silicon carbide (SiC).

The nitridation may be assisted by incident ultraviolet light, incident radio frequency radiation, or an incident electron beam.

In one embodiment, a composition of the substance included in the Group III-V semiconductor layer is graded from a relatively low content nearest to the substrate to a relatively high content furthest from the substrate.

In another embodiment, the Group III-V semiconductor layer is constituted by a superlattice which includes alternating first and second sub-layers of different Group III-V semiconductor compositions, a first composition of the substance in each of the first sub-layers being graded from a relatively low content nearest to the substrate to a relatively high content furthest from the substrate, and a second composition of the substance in each of the second sub-layers being graded from a relatively high content nearest to the substrate to a relatively low content furthest from the substrate.

In still another embodiment, the Group III-V semiconductor layer is constituted by a superlattice which includes alternating first and second sub-layers of different Group III-V semiconductor compositions, a first composition of the substance in each of the first sub-layers being graded from a relatively low content nearest to the substrate to a relatively high content furthest from the substrate, and a second composition of the substance in each of the second sub-layers being graded from a relatively low content nearest to the substrate to a relatively high content furthest from the substrate.

The method may further include the step of epitaxially growing the Group III-V semiconductor layer on the substrate prior to the step of effecting the nitridation of the Group III-V semiconductor layer.

The method may further include the step of effecting wet oxidation of the Group III-V semiconductor layer prior to effecting the nitridation of the Group III-V semiconductor layer.

Furthermore, another aspect of the present invention provides an electronic device including: a substrate; a Group III or Group III-V nitride layer formed on the substrate; and a layered semiconductor structure provided on the nitride layer, wherein the Group III or Group III-V nitride layer is formed in accordance with a method having the aforementioned features.

In a preferred method in accordance with the invention, $Al_xGa_{1-x}As$ layers epitaxially grown on a GaAs substrate are exposed to ammonia gas and converted to nitride layers which may be used in applications such as passivation or as precursors to GaN growth on the GaAs substrate. Such nitridation may be considered analogous to the wet oxidation of $Al_xGa_{1-x}As$, but using the reactivity of aluminium with ammonia, instead of oxygen. In this case, taking the simplest reaction, that is the reaction with AlAs, the proposed reaction mechanism may be simplified as:

$$AlAs+NH_3=AlN+AsH_3$$

By extension, more complex reaction mechanisms may be contemplated such as:

$$Al_xGa_{1-x}As+NH_3=Al_xGa_{1-x}N+AsH_3$$

Methods in accordance with the invention may provide various advantageous effects with respect to the known growth methods described above. By increasing the nitridation reaction rate, it is possible to form thicker nitride layers which is particularly advantageous where such layers are to be used as strain-relieving buffer layers. In this regard, it is advantageous to have as thick a nitride buffer layer as possible to improve the quality of material subsequently grown on the buffer layer. Furthermore, such a technique may have the advantage over other forms of deposition of buffer layers, such as thermal evaporation, in that the initial AlGaAs layer is crystalline. Subsequent nitridation of this layer may retain a significant amount of crystallinity, thus improving the quality of subsequently grown nitride epitaxial layers.

Thus, the invention described herein makes possible the advantage of providing an improved method of growing a Group III nitride or Group III-V nitride layer on a suitable semiconductor substrate.

This and other advantages of the present invention will become apparent to those skilled in the art upon reading and understanding the following detailed description with reference to the accompanying figures.

BRIEF DESCRIPTION OF THE DRAWINGS

In order that the invention may be more fully understood, a preferred growth method in accordance with the invention will now be described, by way of example, with reference to the accompanying drawings, in which.

DESCRIPTION OF THE PREFERRED EMBODIMENTS

Figure 1:
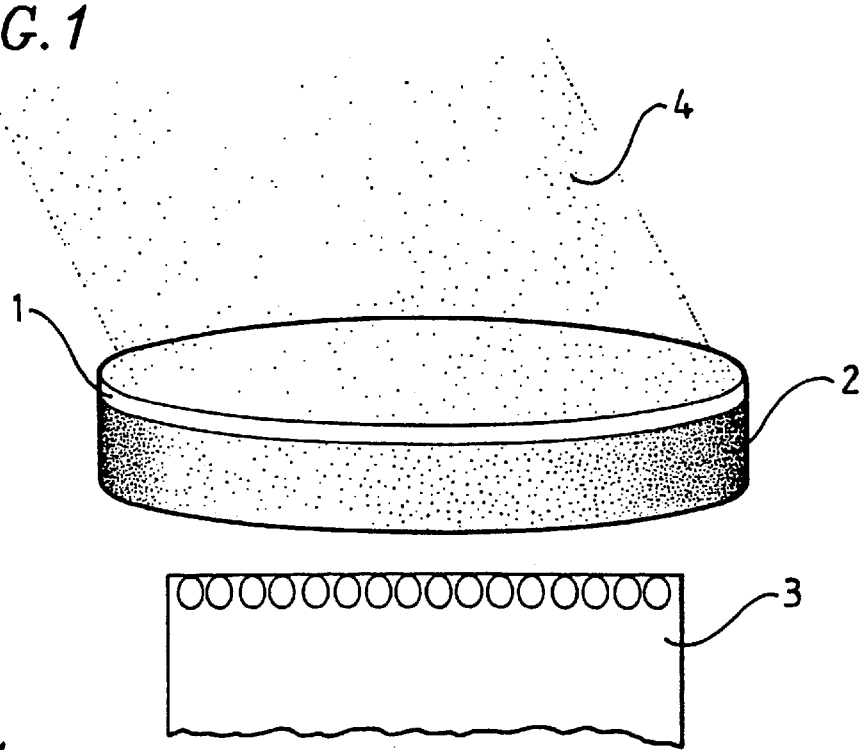
FIG. 1 is a schematic diagram of nitridation of an $Al_xGa_{1-x}As$ layer on a heated GaAs substrate using ammonia gas in accordance with the invention.

In a first method in accordance with the invention, a layer 1 of $Al_xGa_{1-x}As$ is grown by MBE on a GaAs substrate 2, as shown diagrammatically in FIG. 1. The aluminium content x of the layer 1 is in the range 0<x<1, and preferably in the range 0.8<x<1, whereas the thickness d of the layer 1 is in the range d>20 Å, and preferably in the range 500 Å<d<20000 Å. Typically, such a layer 1 is epitaxially grown by placing the substrate 2 in a vacuum chamber and supplying Al, Ga and As fluxes to the substrate 2 which is maintained at an elevated temperature of about 600° C., for example. However, it should be understood that these values are given only by way of example and do not represent the whole range of parameters which may be usable to grow such a layer.

The substrate 2 and the layer 1 are then placed in a chamber (which may or may not be the same as the vacuum chamber within which epitaxial growth of the layer 1 has taken place) and are exposed to an ammonia gas atmosphere 4, as shown diagrammatically in FIG. 1, so that the $Al_xGa_{1-x}As$ layer 1 is chemically converted to a $Al_xGa_{1-x}N$ buffer layer 1. The GaAs substrate 2 and the buffer layer 1 may then be used as a substrate for the subsequent growth of Group III nitride semiconductor materials and devices.

Preferably, the GaAs substrate 2 and the $Al_xGa_{1-x}As$ layer 1 are heated by a heating element 3 during exposure to the ammonia gas, thereby increasing the reaction rate and improving the nitridation of the layer 1. The temperature to which the substrate 2 is heated is limited by the desorption of arsenic and is typically less than 900° C., although it can be in a broad temperature range of 20–900° C. The length of time for which the substrate 2 and the layer 1 are exposed to the ammonia gas atmosphere is typically less than 72 hours, and most conveniently, between 1 to 5 hours. Preferably, it is of the order of 3 hours.

Figure 1A:
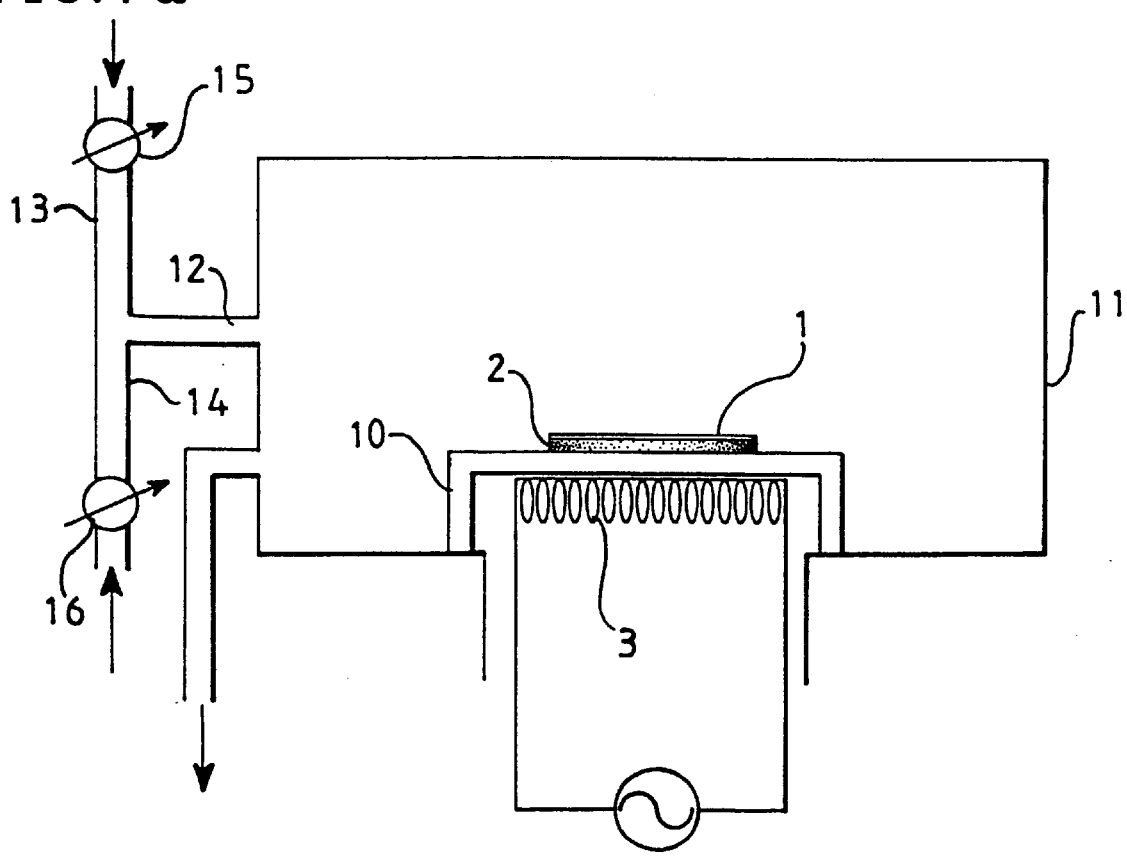
FIG. 1a is a schematic diagram of apparatus, for effecting such nitridation.

FIG. 1a shows possible apparatus for effecting such nitridation of the layer 1 on the substrate 2.

The substrate 2 is placed on a heating stage 10 within a sealed chamber 11, and the temperature of the heating stage 10 is raised by the heating element 3 under thermostatic control so that the temperature of the substrate 2 is maintained at the appropriate temperature for nitridation, for example 600° C. A nitrogen-containing gaseous species, such as a mixture of ammonia and nitrogen gas, is then introduced into the chamber 11 by way of an input port 12 supplied with ammonia gas and optionally nitrogen gas by way of separate input lines 13 and 14 having flow controllers 15 and 16, respectively. The concentration of the ammonia in the gas is typically in the range of 50% to 100%, any balance being made up of one or more other gases, such as $N_2$.

In a preferred method in accordance with the invention, the layer 1 is an $Al_{0.9}Ga_{0.1}As$ layer having a thickness of 500 Å on a GaAs substrate 2. The layer 1 is grown in an MBE chamber, and is then removed to the chamber 11 for nitridation. The substrate 2 is then heated to a temperature of about 600° C. and exposed to a mixture of ammonia and nitrogen gas for three hours. The gas is typically supplied at a rate of between 0.1 and 10 liter/minute, and preferably at a rate of about 1 liter/minute.

In an alternative method, nitridation of the layer 1 is effected inside the MBE chamber. The method is essentially similar to that already described except that the substrate 2 remains in the same position during both epitaxial growth of the layer 1 and subsequent nitridation of the layer 1. The MBE chamber is normally kept under extreme vacuum conditions for the sake of material purity.

Previously proposed methods for effecting nitridation prior to growth of Group III nitride layers have involved the bare surface of the GaAs substrate 2, and have met with limited success due to the low reaction rate of GaAs material with nitrogen and the resulting difficulty of formation of thick nitride layers. However, preferred methods in accordance with the invention make use of a layer of a semiconductor material incorporating aluminium, such as $Al_xGa_{1-x}As$, to increase the reaction rate and hence the maximum thickness of the nitride layer in order to produce a strain-relieving buffer layer. Furthermore, as shown by M. Kamp et al. in Mat. Res. Soc. Symposium Proceedings, Vol. 449, pp. 161–172 (1996), there is a kinetic barrier to the dissociation of ammonia into atomic nitrogen, and there is evidence to suggest that a catalyst can promote this dissociation. Moreover, S. S. Liu et al. suggests in J. Electrochem. Soc., Vol. 125, no. 7, pp. 1161–1169 (1978) that gallium has such a catalytic effect, and it is possible that aluminium may also promote this type of reaction in AlGaAS.

Figure 2:
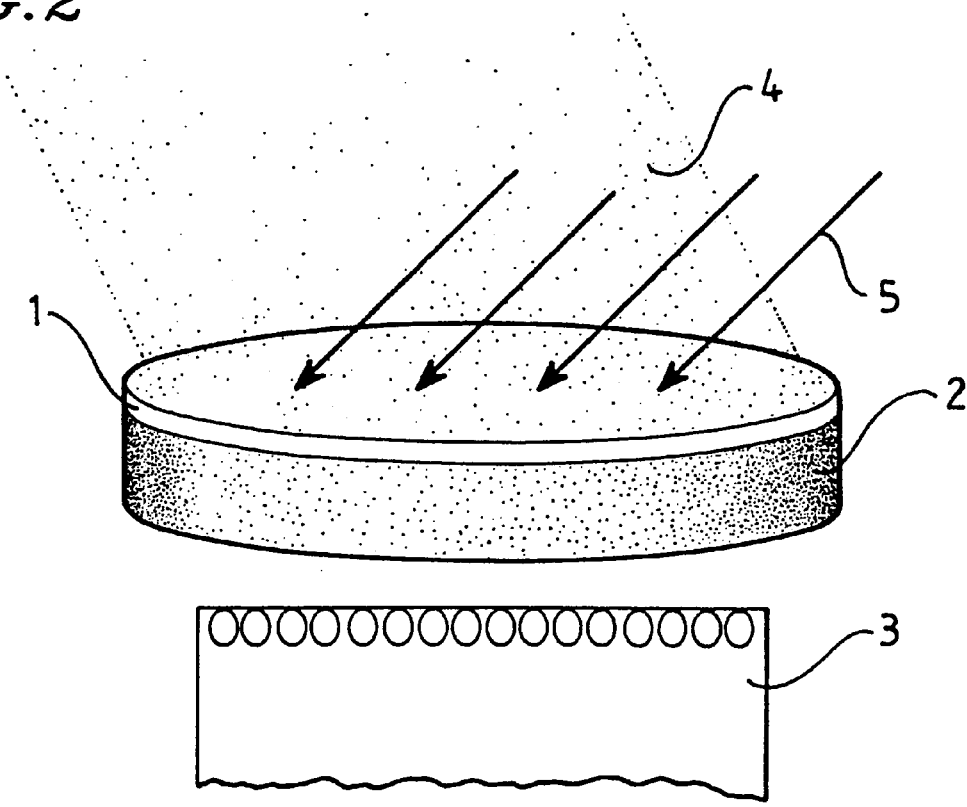
FIG. 2 is a schematic diagram of nitridation of an $Al_xGa_{1-x}As$ layer on a heated GaAs substrate using ammonia gas in accordance with the invention, with the assistance of incident ultraviolet light.

In a further embodiment shown diagrammatically in FIG. 2, the $Al_xGa_{1-x}As$ layer 1 is illuminated by ultraviolet light 5 while being exposed to the flow of ammonia gas. The high energy photons in the ultraviolet light 5 assist the nitridation of the layer 1 by ionizing the $NH_3$ into more reactive nitrogen ions.

In a further, non-illustrated embodiment of the invention, the incident ammonia gas is simultaneously excited by a radio-frequency (RF) source to assist in cracking of the ammonia molecules.

In a still further, non-illustrated embodiment of the invention, the incident ammonia gas or the surface of the layer 1 is excited by an electron beam source to assist in cracking of the ammonia molecules in the gas flow or at the semiconductor surface.

In a further variant of the invention, the layer 1 is exposed to liquid or solid ammonia instead of ammonia gas.

In a further, non-illustrated embodiment of the invention, the aluminium composition of the layer 1 is graded in the direction from the substrate to the free surface of the layer 1. For example, the portion of the layer 1 nearest to the substrate 2 may have the lowest aluminium content while the portion of the layer 1 furthest from the substrate 2 may have the highest aluminium content. The grading typically ranges from GaAs at the substrate interface to AlAS at the free surface of the layer 1. In a preferred embodiment, the grading of the $Al_xGa_{1-x}As$ layer varies incrementally from x=0 to x=0.9, so that the constituency of the layer varies from GaAs to $Al_{0.9}Ga_{0.1}As$. After nitridation of the layer 1 in the manner already described, the resultant buffer layer consists of graded nitride sub-layers which serve to better accommodate the mismatch in the lattice constant between the GaAs substrate 2 and the subsequently grown Group III nitride layers.

Figure 3:
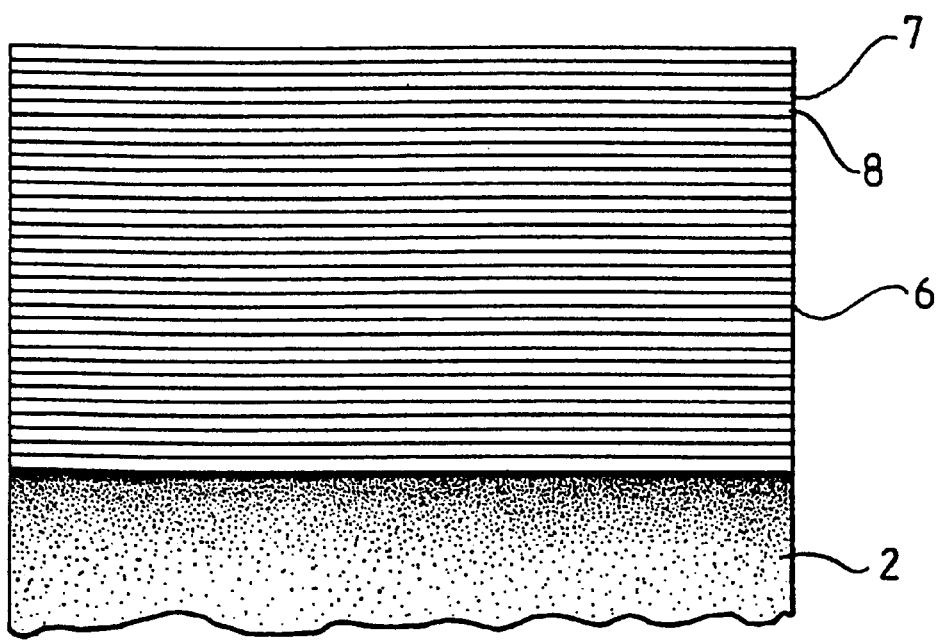
FIG. 3 is a schematic diagram of the nitridation of an AlGaAs superlattice layer on a heated GaAs substrate using ammonia gas in accordance with a development of the invention.

In a further embodiment of the invention schematically shown in FIG. 3, a superlattice layer 6 of AlGaAs is grown on the substrate and subjected to nitridation in the manner already described above, in order to produce a buffer layer which is particularly effective in minimizing the effects of strain. The superlattice layer 6 consists of alternate sub-layers 7 and 8 of semiconductor materials of different compositions, that is of compositions $Al_xGa_{1-x}As$ and $Al_yGa_{1-y}As$, respectively, where 0<x<1 and 0<y<1 with x and y being not related. The thickness of each of the sub-layers is of the order of a few angstroms, and the total thickness d of the layer 6 is in the range 0<d<500 Å. The nitridation rate in each sub-layer 7 or 8 depends on the aluminium content of the sub-layer, and effectively, only the sub-layers of high aluminium content are subjected to nitridation. Because the strain in a layer depends on the thickness of the layers, the strain in such a composite layer 6 will be less than that in a layer of uniform composition provided that the individual sub-layers are sufficiently thin.

In the above case in which the AlGaAs superlattice layer 6 including the alternate sub-layers 7 and 8 is incorporated, the portion of either of the sub-layers 7 and 8 nearest to the substrate 2 may have the lowest aluminium content and the portion thereof furthest from the substrate 2 may have the highest aluminium content, while the portion of the other of the sub-layers 7 and 8 nearest to the substrate 2 may have the highest aluminium content and the portion thereof furthest from the substrate 2 may have the lowest aluminium content. Alternatively, the portions of both of the sub-layers 7 and 8 nearest to the substrate 2 may have the lowest aluminium content while the portions thereof furthest from the substrate 2 may have the highest aluminium content.

Figure 4:
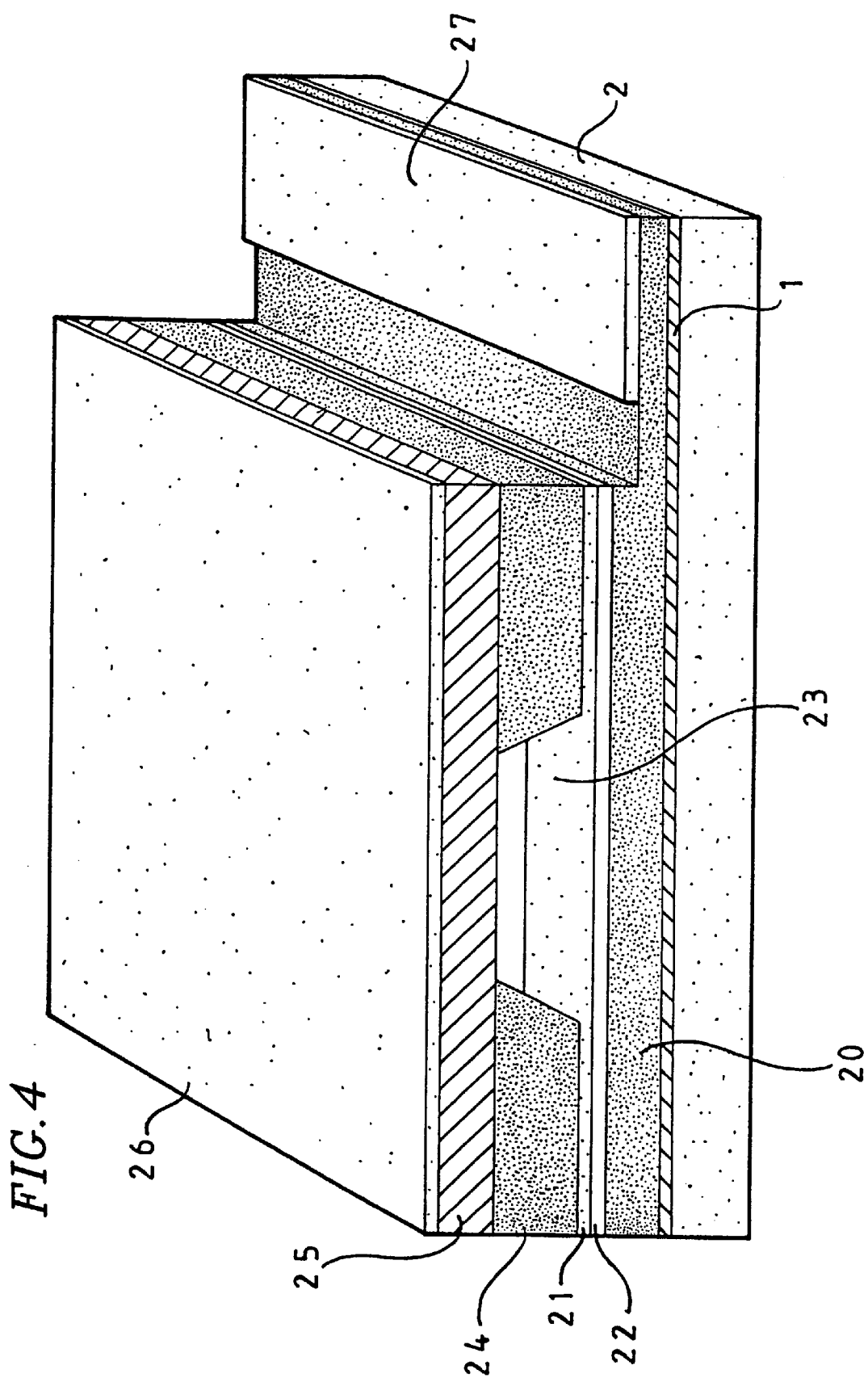
FIG. 4 is a schematic diagram of a laser diode which is fabricated by a method in accordance with the invention.

FIG. 4 diagrammatically shows the structure of a blue laser diode fabricated on a GaAs substrate 2 having an AlGaN buffer layer 1.

The AlGaN buffer layer 1 is epitaxially grown and chemically converted by a method in accordance with the invention as described above with reference to FIG. 1. An n-type GaN layer 20 (doped with Si for example) and a p-type GaN layer 21 (doped with Mg for example) are then grown in the conventional manner on the substrate 2 and layer 1, with an active region 22 being formed at the junction of the layers 20 and 21 such that, in operation of the laser diode, the application of electrical voltage to the diode causes holes from the p-type layer 21 and electrons from the n-type layer 20 to be injected into the active region 22 so that the resultant recombination of electrons and holes in the active region 22 causes light emission and laser action. The p-type layer 21 is initially formed as a planar structure which is then subjected to a photolithographic etching process so as to form a ridge structure 23 which acts as a waveguide to confine the light generated in the active region 22. To further improve the optical confinement of the light, as well as to restrict the injected current to the active region 22 under the ridge structure 23, an n-type GaN layer 24 is grown around the ridge structure 23. Furthermore, a $p^+$-type GaN layer 25 is grown on top of the ridge structure 23 and the layer 24, and a p-type contact layer 26 is provided on top of the layer 25 as an electrical contact for the injection of holes into the active region 22. An n-type contact layer 27 is provided for the injection of electrons into the active region 22. A section of the structure is etched to reveal the n-type contact layer 27 utilizing standard lithographic and etching processes.

Furthermore, the following are experimental evidence for the nitridation of AlGaAs, obtained by the present inventors in the course of the invention.

Figure 5:
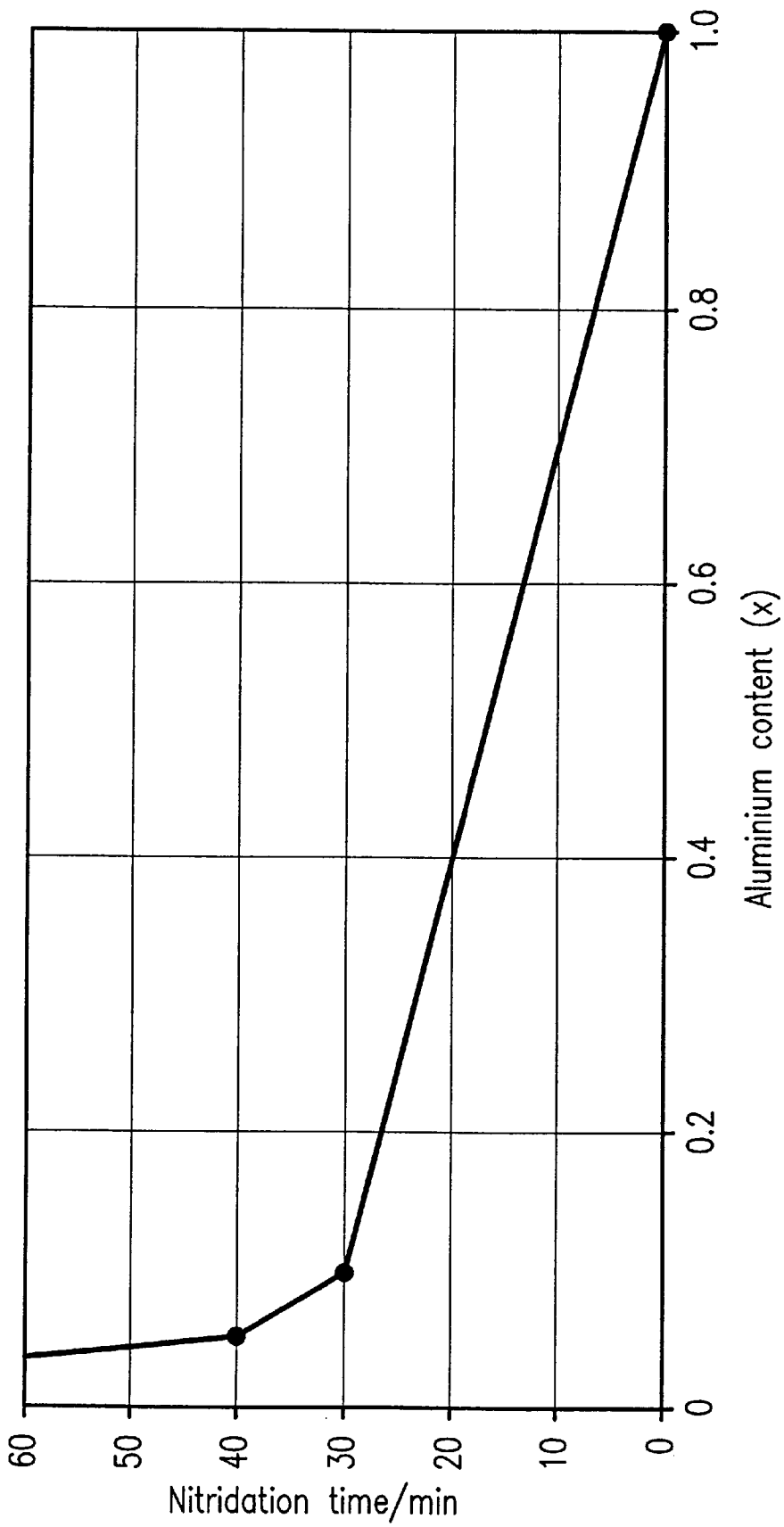
FIG. 5 is a diagram indicating an effect of aluminium content on the nitridation of $Al_xGa_{1-x}As$.

FIG. 5 shows experimental evidence for the catalytic effect of Al in the cracking of $NH_3$. The experimental details are as follows: layers of $Al_xGa_{1-x}As$ were grown on GaAs substrates and then exposed to $NH_3$ gas under UHV (ultra-high vacuum) conditions in an MBE apparatus. The pressure of the $NH_3$ gas above the substrate was $3.2 \times 10^{-6}$ Torr and the substrate was heated to a temperature of 600° C.

FIG. 5 shows the effect of increasing aluminium content on the nitridation of the AlGaAs layers. Conversion of the surface of the AlGaAs layer to a nitride layer (AlGaN or AlGaAsN) was determined by studying the RHEED (Reflection High Energy Electron Diffraction) patterns obtained from the semiconductor surface. The RHEED patterns can be observed in MBE by diffracting high energy electron beams from the semiconductor surface and observing the diffracted patterns on a phosphor screen. Since the electrons are diffracted by surface atoms on the semiconductor surface, the actual diffraction pattern observed is a good probe of the surface structure. In particular, it can be used to measure the lattice spacing of the surface atomic structure. Since the atomic structure of an AlGaAs surface and an AlGaN or AlGaAsN surface is different, the RHEED patterns can be used to indicate whether nitridation has occurred.

FIG. 5 shows that with increase in the aluminium content in AlGaAs, the time required for nitridation (determined by a specified change in the RHEED patterns) is reduced drastically. There is no observed nitridation of GaAs when exposed to $NH_3$ for times in excess of 40 minutes, whereas for AlAs, the nitridation occurs in approximately 3 seconds. This result indicates that aluminium promotes the nitridation effect by acting a catalyst for the cracking of $NH_3$.

Figure 6:
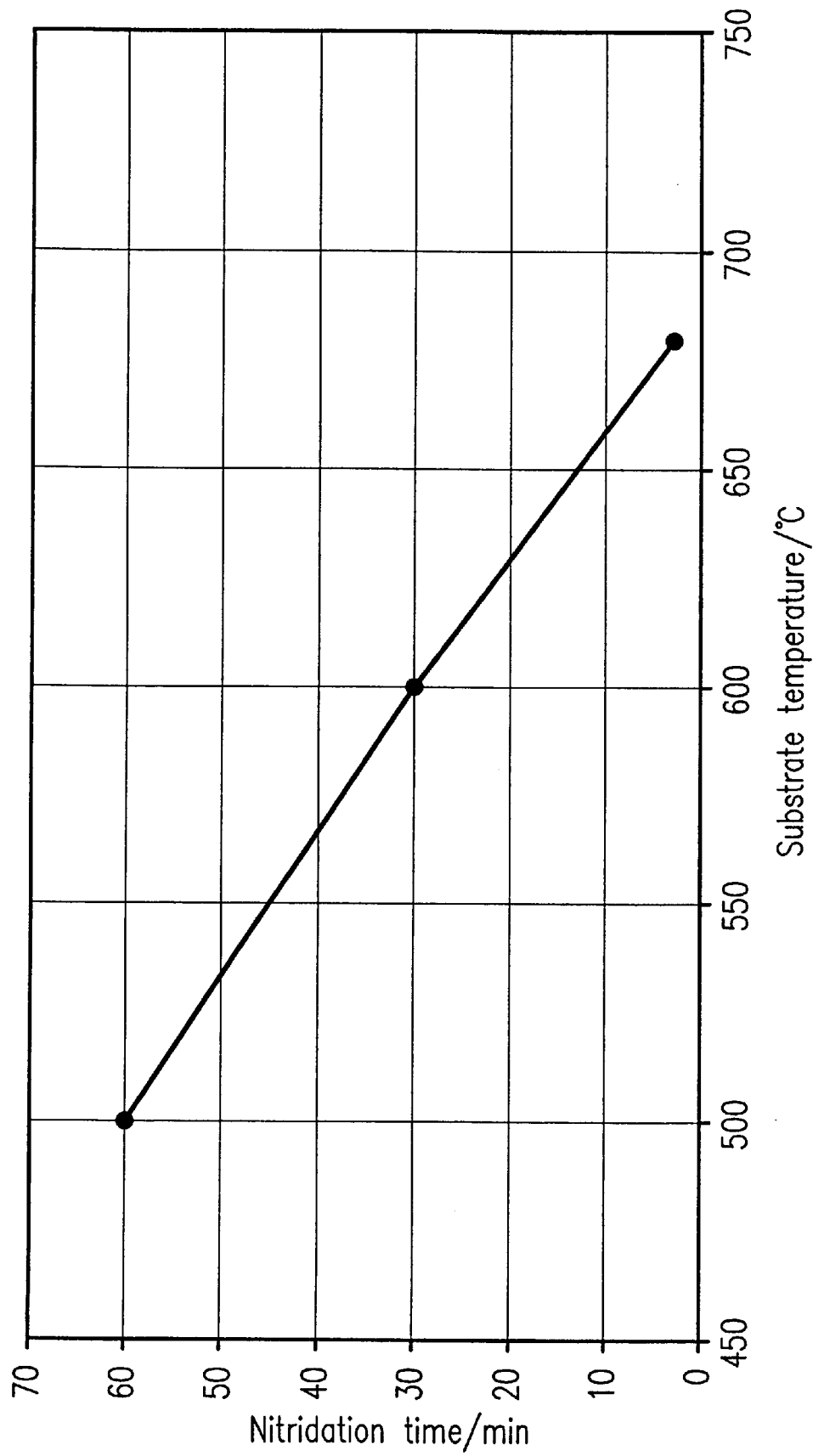
FIG. 6 is a diagram indicating temperature dependence of AlGaAs nitridation.

FIG. 6 shows effect of increased substrate temperature on the nitridation process. The experimental conditions are the same as those for FIG. 5. Specifically, a layer of $Al_{0.1}Ga_{0.9}As$ was grown on a GaAs substrate, and then exposed to $3.2 \times 10^{-6}$ Torr of $NH_3$ in an MBE chamber. Nitridation of the AlGaAs layer was observed using the RHEED patterns.

FIG. 6 shows the effect of increasing the substrate temperature (and hence the layer temperature) on the nitridation time. Clearly, the nitridation depends strongly on the layer temperature with the nitridation time decreasing as the temperature is increased. This shows that as well as the catalytic effect of Al on the $NH_3$ cracking, $NH_3$ is also thermally cracked.

FIGS. 5 and 6 illustrates the nitridation of AlGaAs when exposed to $NH_3$ gas. Since RHEED is an experimental technique that is, for the most part, limited to the surface investigation, these results indicate that the surface of the AlGaAs layer has been nitrided. Although they do not show evidence for nitridation extending into the bulk of the AlGaAs layer, they do not preclude this effect.

Evidence for the bulk nitridation of GaAs is given in the aforementioned reference by M. E. Jones et al. in Appl. Phys. Letts., vol. 67, no. 4, pp. 524–544 (1995). Specifically, they show that exposure of GaAs to 1 Torr of $NH_3$ at various temperatures leads to a nitridation extending several thousand angstroms into the GaAs layer.

Figure 7:
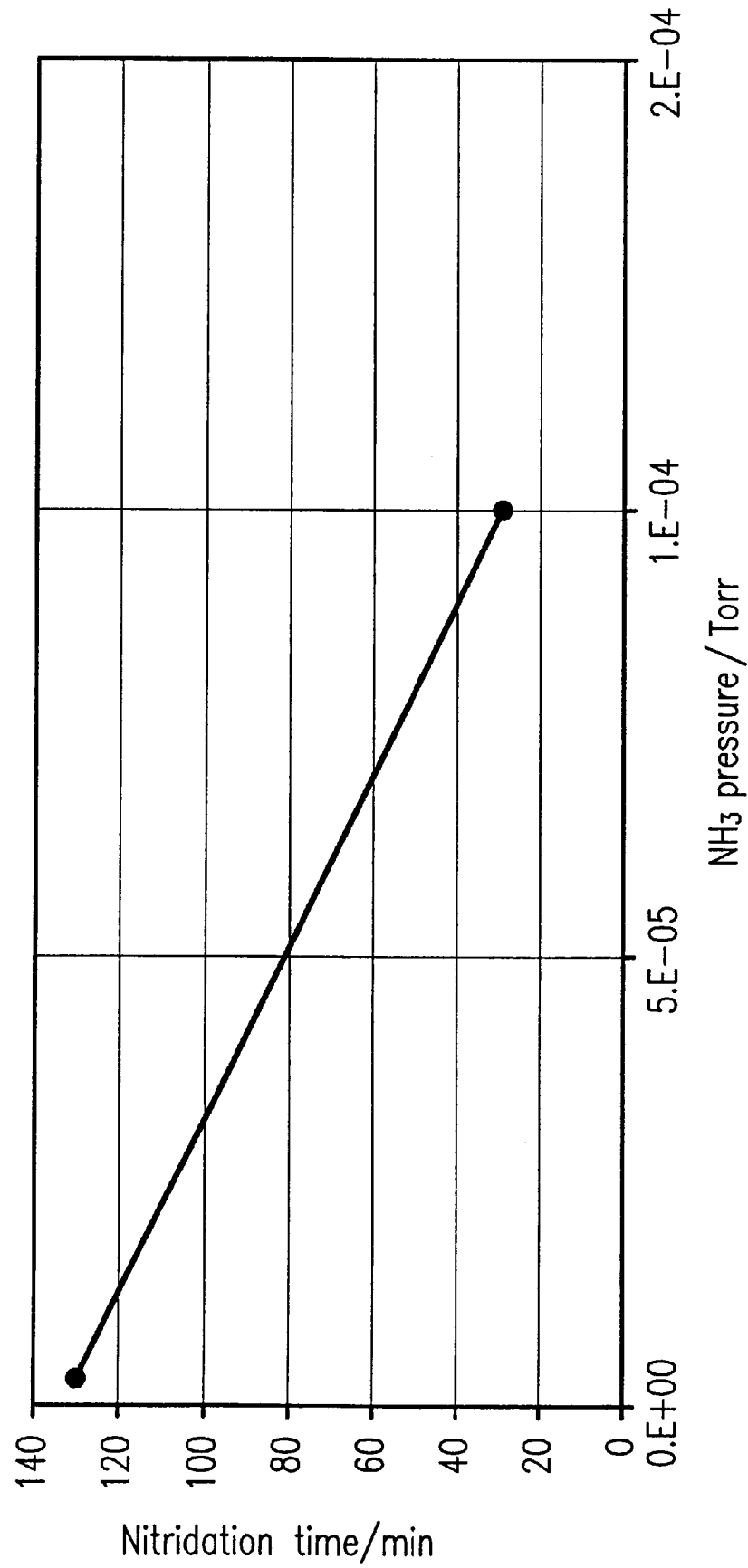
FIG. 7 is a diagram indicating an effect of $NH_3$ pressure on nitridation of GaAs.

Furthermore, the present inventors have experimentally determined that the $NH_3$ pressure has a strong effect on the nitridation time of GaAs. FIG. 7 shows the effect of increased $NH_3$ pressure on the nitridation of GaAs at a temperature of 580° C. With an increased $NH_3$ pressure, the nitridation time decreases. This result, combined with the results in the Jones et al. reference, is strong evidence that the experiments on the AlGaAs nitridation (see FIGS. 5 and 6), if carried out at higher $NH_3$ pressures, will lead to significant bulk nitridation of the AlGaAs layers as described in the present application.

The invention is not limited in its scope to GaAs substrates and, in other embodiments of the invention, an $Al_xGa_{1-x}As$ layer is grown on some other suitable substrate, such as a sapphire, silicon (Si) or silicon carbide (SiC) substrate, and converted to a nitride buffer layer by exposure to ammonia gas.

Furthermore, the invention is not limited to nitridation by means of ammonia. In further embodiments of the invention, either pure nitrogen gas or any nitrogen-containing compound may be used to affect nitridation of the layer. Examples of suitable compounds are hydrazine and organonitrogenous compounds. The suitability of a particular compound for nitridation will depend on a number of factors, but an important consideration is the ability to produce free-radical or atomic nitrogen for nitridation of the layer.

Other methods are also within the scope of the invention. For example, in a further embodiment of the invention, the nitridation of the $Al_xGa_{1-x}As$ layer produces a quaternary buffer layer of AlGaAsN which may form a better buffer layer for subsequent growth of nitride layers. This may be achieved by modifying the nitridation parameters (for example by varying the substrate temperature) such that nitrogen does not fully substitute for arsenic in the AlGaAs layer.

In a further embodiment of the invention, the $Al_xGa_{1-x}As$ layer is first oxidized by the wet oxidation process to form an oxidized layer, and nitridation of the oxidized layer is then effected using ammonia to form a nitride buffer layer. Under certain circumstances, the reactivity of the oxidized layer with ammonia may be better than that of the unoxidized layer.

In other embodiments of the invention, as AlGaInP layer is used in place of the AlGaAs layer, and nitridation of the layer is again effected using ammonia gas to form the nitride buffer layer.

Other embodiments of the invention use layers which incorporate indium (In) in place of Ga. In one such embodiment, an $Al_xIn_{1-x}As$ layer is epitaxially grown on the substrate and nitridation of the layer is effected using ammonia gas to form the nitride buffer layer. The resultant buffer layer of InAlN or InAlAsN may be better suited to the subsequent growth of nitride layers than the buffer layers of other embodiments.

It is even possible to contemplate embodiments in which Al is replaced by In in the layer. In one such embodiment, an $In_xGa_{1-x}As$ layer is epitaxially grown on the substrate and nitridation of the layer is again effected using ammonia gas so as to form a buffer layer of InGaN or InGaAsN.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of growing a Group III or Group III-V nitride layer on a substrate, comprising the steps of:

locating, within a chamber, the substrate having on its surface a Group III-V semiconductor layer incorporating a substance which is strongly reactive with nitrogen; and subsequently effecting nitridation of the Group III-V semiconductor layer by introducing a species containing nitrogen to cause a reaction between the nitrogen and the substance, wherein the substance comprises aluminum and the Group III or Group III-V nitride layer comprises aluminum and a group III element other than aluminum.

2. A method according to claim 1, wherein a constituting material of the Group III-V semiconductor layer is different from a constituting material of the substrate.

3. A method according to claim 1, wherein the reaction between nitrogen and the substance causes the Group III-V semiconductor layer to convert into the nitride layer on the substrate.

4. A method according to claim 1, wherein the nitrogen-containing species is ammonia.

5. A method according to claim 1, wherein the substance further comprises indium.

6. A method according to claim 1, wherein the substance further comprises gallium.

7. A method according to claim 1, wherein the Group III-V semiconductor layer incorporates arsenic.

8. A method according to claim 1, wherein the Group III-V semiconductor layer incorporates phosphorus.

9. A method according to claim 1, wherein the Group III-V semiconductor layer comprises aluminium gallium arsenide (AlGaAs).

10. A method according to claim 1, wherein the Group III-V semiconductor layer comprises aluminium indium arsenide (AlInAs).

11. A method according to claim 1, wherein the Group III-V semiconductor layer comprises gallium indium phosphide (AlGaInP).

12. A method according to claim 1, wherein the substrate is made of gallium arsenide (GaAs), silicon (Si), or silicon carbide (SiC).

13. A method according to claim 1, wherein the nitridation is assisted by incident ultraviolet light.

14. A method according to claim 1, wherein the nitridation is assisted by incident radio frequency radiation.

15. A method according to claim 1, wherein the nitridation is assisted by an incident electron beam.

16. A method according to claim 1, wherein a composition of the substance included in the Group III-V semiconductor layer is graded from a relatively low content nearest to the substrate to a relatively high content furthest from the substrate.

17. A method according to claim 1, wherein the Group III-V semiconductor layer is constituted by a superlattice which includes alternating first and second sub-layers of different Group III-V semiconductor compositions, a first composition of the substance in each of the first sub-layers being graded from a relatively low content nearest to the substrate to a relatively high content furthest from the substrate, and a second composition of the substance in each of the second sub-layers being graded from a relatively high content nearest to the substrate to a relatively low content furthest from the substrate.

18. A method according to claim 1, wherein the Group III-V semiconductor layer is constituted by a superlattice which includes alternating first and second sub-layers of different Group III-V semiconductor compositions, a first composition of the substance in each of the first sub-layers being graded from a relatively low content nearest to the substrate to a relatively high content furthest from the substrate, and a second composition of the substance in each of the second sub-layers being graded from a relatively low content nearest to the substrate to a relatively high content furthest from the substrate.

19. A method according to claim 1, further comprising the step of epitaxially growing the Group III-V semiconductor layer on the substrate prior to the step of effecting the nitridation of the Group III-V semiconductor layer.

20. A method according to claim 1, further comprising the step of effecting wet oxidation of the Group III-V semiconductor layer prior to effecting the nitridation of the Group III-V semiconductor layer.

21. A method according to claim 1, wherein a portion of the Group V element of the Group III-V semiconductor layer is exchanged for N.

22. A method according to claim 1, wherein the nitrogen-containing species is hydrazine.

23. A method according to claim 1, wherein the nitrogen containing species is an organo-nitrogen compound.

24. A method of growing a Group III-nitride or Group III-V-nitride semiconductor layer on a substrate comprising the steps of:

locating within the chamber, the substrate having on its surface a group III-V semiconductor layer incorporating aluminium; and subsequently effecting nitridation of the group III-V semiconductor layer by introducing a substance containing nitrogen to cause a reaction between the nitrogen and the aluminium, thereby producing a Group III-nitride or Group III-V-nitride semiconductor layer, wherein the Group III or Group III-V nitride layer comprises aluminum and a group III element other than aluminum.

* * * * *